(12) United States Patent
He et al.

(10) Patent No.: US 10,700,107 B2
(45) Date of Patent: Jun. 30, 2020

(54) LOW-TEMPERATURE POLYSILICON THIN FILM TRANSISTOR, METHOD OF MANUFACTURING THE SAME, AND DISPLAY SUBSTRATE

(71) Applicant: BOE Technology Group Co., Ltd., Beijing (CN)

(72) Inventors: Xiaolong He, Beijing (CN); Zhifu Li, Beijing (CN); Guangcai Yuan, Beijing (CN); Haijiao Qian, Beijing (CN); Dongsheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/781,327

(22) PCT Filed: Oct. 27, 2017

(86) PCT No.: PCT/CN2017/108031
§ 371 (c)(1),
(2) Date: Jun. 4, 2018

(87) PCT Pub. No.: WO2018/188319
PCT Pub. Date: Oct. 18, 2018

(65) Prior Publication Data
US 2019/0259879 A1  Aug. 22, 2019

(30) Foreign Application Priority Data
Apr. 13, 2017 (CN) .......................... 2017 1 0243190

(51) Int. Cl.
*H01L 27/12* (2006.01)
*H01L 29/786* (2006.01)
(Continued)

(52) U.S. Cl.
CPC .... *H01L 27/1274* (2013.01); *H01L 21/02667* (2013.01); *H01L 21/02675* (2013.01);
(Continued)

(58) Field of Classification Search
CPC ......... H01L 29/66765; H01L 29/78669; H01L 29/78678; H01L 29/78696; H01L 27/1229; H01L 27/1274; H01L 27/1285
See application file for complete search history.

(56) References Cited

U.S. PATENT DOCUMENTS 5,864,150 A * 1/1999 Lin ................... H01L 29/66765
257/61
8,021,937 B2   9/2011 Roh et al.
(Continued)

FOREIGN PATENT DOCUMENTS

CN       1725510 A     1/2006
CN       1731571 A     2/2006
(Continued)

OTHER PUBLICATIONS

Extended European search report for European Patent Application No. 17898329.2, dated Oct. 9, 2019, 8 pages.
(Continued)

*Primary Examiner* — Zandra V Smith
*Assistant Examiner* — Molly K Reida
(74) *Attorney, Agent, or Firm* — Westman, Champlin & Koehler, P.A.

(57) ABSTRACT

It is provided a low-temperature polysilicon thin film transistor formed on a substrate, including: a gate electrode on the substrate; an active layer on the gate electrode, the active layer including a channel region, the channel region having a polysilicon region and amorphous silicon regions respectively on both sides of the polysilicon region; and an etch stop layer on the active layer. An orthogonal projection of
(Continued)

the polysilicon region on the substrate is located within an orthogonal projection of the gate electrode on the substrate, and an area of the orthogonal projection the polysilicon region on the substrate is smaller than an area of the orthogonal projection of the gate electrode on the substrate. The orthogonal projection of the polysilicon region on the substrate is located within an orthogonal projection of the etch stop layer on the substrate.

14 Claims, 8 Drawing Sheets

(51) Int. Cl.
    *H01L 29/10*       (2006.01)
    *H01L 21/268*     (2006.01)
    *H01L 29/66*       (2006.01)
    *H01L 21/02*      (2006.01)

(52) U.S. Cl.
    CPC .......... *H01L 27/12* (2013.01); *H01L 27/1229* (2013.01); *H01L 29/10* (2013.01); *H01L 29/6675* (2013.01); *H01L 29/66765* (2013.01); *H01L 29/786* (2013.01); *H01L 29/78606* (2013.01); *H01L 29/78663* (2013.01); *H01L 29/78678* (2013.01); *H01L 29/78696* (2013.01)

(56) References Cited

U.S. PATENT DOCUMENTS

| | | |
|---|---|---|
| 2005/0218403 A1 | 10/2005 | Kuo |
| 2007/0284580 A1 | 12/2007 | Lim et al. |
| 2009/0057672 A1* | 3/2009 | Kobayashi ........ H01L 29/78696 257/59 |
| 2009/0152554 A1* | 6/2009 | Cho ..................... H01L 27/1229 257/59 |
| 2010/0117090 A1 | 5/2010 | Roh et al. |
| 2010/0301339 A1 | 12/2010 | Morimura et al. |
| 2011/0079780 A1 | 4/2011 | Yamayoshi et al. |
| 2013/0153028 A1 | 6/2013 | Hayashi et al. |
| 2015/0318362 A1* | 11/2015 | Wang ................ H01L 29/66765 257/72 |
| 2019/0035629 A1* | 1/2019 | Mizumura .......... H01L 27/1222 |

FOREIGN PATENT DOCUMENTS

| | | |
|---|---|---|
| CN | 101552209 A | 10/2009 |
| CN | 101740499 A | 6/2010 |
| CN | 105870203 A | 8/2016 |

OTHER PUBLICATIONS

International Search Report and Written Opinion, including English translation of Box V of the Written Opinion, for International Application No. PCT/CN2017/108031, dated Jan. 24, 2018, 15 pages.

* cited by examiner

LOW-TEMPERATURE POLYSILICON THIN FILM TRANSISTOR, METHOD OF MANUFACTURING THE SAME, AND DISPLAY SUBSTRATE

CROSS-REFERENCE TO RELATED APPLICATION

This application is a Section 371 National Stage Application of International Application No. PCT/CN2017/108031, filed on Oct. 27, 2017, entitled "LOW-TEMPERATURE POLYSILICON THIN FILM TRANSISTOR, METHOD OF MANUFACTURING THE SAME, AND DISPLAY SUBSTRATE", which has not yet published, which claims priority to Chinese Application No. 201710243190.3, filed on Apr. 13, 2017, incorporated herein by reference in their entirety.

BACKGROUND OF THE DISCLOSURE

Field of the Disclosure

The present disclosure relates to the field of display technology, and in particular, to a low-temperature polysilicon thin film transistor, a method of manufacturing the low-temperature polysilicon thin film transistor, and a display substrate including the low-temperature polysilicon thin film transistor.

Description of the Related Art

Since polysilicon (p-Si) thin film transistors (TFTs) have advantages such as high mobility and low power consumption compared to amorphous silicon (a-Si) thin film transistors, the polysilicon thin film transistors are increasingly widely used in recent years.

Early polysilicon thin film transistors are manufactured at a temperature up to 1000° C., thus choices of substrate materials may be greatly limited. In recent years, with development of technologies such as laser processing, the polysilicon thin film transistors may be manufactured at a temperature below 600° C. The polysilicon thin film transistors formed through such manufacturing process are generally referred to as low-temperature polysilicon (abbreviated as LTPS) thin film transistors.

A common LTPS thin film transistor is generally a top-gate thin film transistor. When the top-gate LTPS thin film transistor is manufactured, some processes may be required, for example, it is generally required to form a light shielding layer, perform source/drain doping, and provide a lightly doped drain (abbreviated as LDD) structure. The manufacturing processes are complicated and the cost is high.

In addition, in an existing bottom-gate LTPS thin film transistor, in order to solve a problem of excessive channel leakage current, it is generally required to form a Si/p-Si/a-Si channel. However, a positional accuracy of the middle p-Si cannot be guaranteed in a common manufacturing process, thereby affecting a width and a uniformity of the channel of the thin film transistor. Moreover, in the common manufacturing process for the bottom-gate LTPS thin film transistor, there is also a problem that an active layer is damaged due to back channel etching.

SUMMARY

According to an aspect of the present disclosure, it is provided a low-temperature polysilicon thin film transistor.

According to an exemplary embodiment, the low-temperature polysilicon thin film transistor is formed on a substrate, the thin film transistor may include:

a gate electrode on the substrate;

an active layer on the gate electrode, the active layer including a channel region, the channel region having a polysilicon region and amorphous silicon regions respectively on both sides of the polysilicon region; and an etch stop layer on the active layer, wherein an orthogonal projection of the polysilicon region on the substrate is located within an orthogonal projection of the gate electrode on the substrate, and an area of the orthogonal projection of the polysilicon region on the substrate is smaller than an area of the orthogonal projection of the gate electrode on the substrate, and wherein the orthogonal projection of the polysilicon region on the substrate is located within an orthogonal projection of the etch stop layer on the substrate.

According to some embodiments, the area of the orthogonal projection of the polysilicon region on the substrate is smaller than an area of the orthogonal projection of the etch stop layer on the substrate.

According to some embodiments, the orthogonal projection of the etch stop layer on the substrate is located within the orthogonal projection of the gate electrode on the substrate, and the area of the orthogonal projection of the etch stop layer on the substrate is smaller than the area of the orthogonal projection of the gate electrode on the substrate.

According to some embodiments, the low-temperature polysilicon thin film transistor may further include an ohmic contact layer on both the etch stop layer and the active layer. In a region corresponding to the polysilicon region, a portion of the ohmic contact layer on the etch stop layer is etched, and both ends of the etch stop layer in a direction parallel to the substrate are covered by the ohmic contact layer.

According to some embodiments, the low-temperature polysilicon thin film transistor may further include: a source electrode and a drain electrode both on the ohmic contact layer. A pattern of the source electrode and the drain electrode is the same as a pattern of the ohmic contact layer.

According to another aspect of the present disclosure, it is further provided a display substrate.

According to an exemplary embodiment, the display substrate may include the low-temperature polysilicon thin film transistor described by any one of the above embodiments.

According to a further aspect of the present disclosure, it is further provided a method of manufacturing a low-temperature polysilicon thin film transistor.

According to an exemplary embodiment, the method of manufacturing a low-temperature polysilicon thin film transistor may include:

providing a substrate;

forming a gate electrode on the substrate;

forming an amorphous silicon layer on the gate electrode;

forming an ohmic contact layer on the amorphous silicon layer;

forming a source/drain layer on the ohmic contact layer;

forming a pattern of the ohmic contact layer and a pattern of the source/drain layer through a patterning process so that both a portion of the ohmic contact layer in a region corresponding to a polysilicon region to be formed and a portion of the source/drain layer in the region corresponding to the polysilicon region to be formed are etched; and performing a laser annealing process on the amorphous silicon layer by using a mask so that amorphous silicon in a partial region of the amorphous silicon layer is converted into polysilicon.

An orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

According to some embodiments, the method may further include:

forming an etch stop layer on the amorphous silicon layer; and forming a pattern of the etch stop layer through a patterning process, wherein the step of forming the ohmic contact layer on the amorphous silicon layer may include: forming the ohmic contact layer on both the pattern of the etch stop layer and the amorphous silicon layer, and wherein an orthogonal projection of a formed polysilicon region on the substrate falls within an orthogonal projection of the pattern of the etch stop layer on the substrate, and an area of the orthogonal projection of the formed polysilicon region on the substrate is smaller than an area of the orthogonal projection of the pattern of the etch stop layer on the substrate.

According to some embodiments, the orthogonal projection of the pattern of the etch stop layer on the substrate falls within the orthogonal projection of the gate electrode on the substrate, and the area of the orthogonal projection of the pattern of the etch stop layer on the substrate is smaller than the area of the orthogonal projection of the gate electrode on the substrate.

According to some embodiments, the step of forming a pattern of the ohmic contact layer and a pattern of the source/drain layer through a patterning process so that both a portion of the ohmic contact layer in a region corresponding to a polysilicon region to be formed and a portion of the source/drain layer in the region corresponding to the polysilicon region to be formed are etched may include:

etching the portion of the ohmic contact layer in the region corresponding to the polysilicon region to be formed and the portion of the source/drain layer in the region corresponding to the polysilicon region to be formed, so that a portion of the pattern of the etch stop layer is exposed and both ends of the pattern of the etch stop layer in a direction parallel to the substrate are covered by the ohmic contact layer.

According to some embodiments, after the step of performing a laser annealing process on the amorphous silicon layer by using a mask so that amorphous silicon in a partial region of the amorphous silicon layer is converted into polysilicon, the method may further include:

etching a portion of the amorphous silicon layer on the substrate by using at least one of the pattern of the ohmic contact layer and the pattern of the source/drain layer as a mask, the portion of the amorphous silicon layer being not covered by any one of the pattern of the etch stop layer, the pattern of the ohmic contact layer and the pattern of the source/drain layer.

According to some embodiments, the step of performing a laser annealing process on the amorphous silicon layer by using a mask so that amorphous silicon in a partial region of the amorphous silicon layer is converted into polysilicon may include:

keeping a laser light source stationary to prolong a time period for which a laser beam emitted by the laser light source irradiates on the amorphous silicon layer, so that amorphous silicon in a predetermined portion of the amorphous silicon layer is converted into polysilicon.

According to some embodiments, the step of forming a pattern of the ohmic contact layer and a pattern of the source/drain layer through a patterning process may include:

forming the pattern of the ohmic contact layer and the pattern of the source/drain layer through one patterning process such that the pattern of source/drain layer is the same as the pattern of the ohmic contact layer.

According to some embodiments, the step of forming a pattern of the ohmic contact layer and a pattern of the source/drain layer through a patterning process may include:

forming the pattern of the source/drain layer through wet etching; and forming the pattern of the ohmic contact layer through dry etching.

According to another further aspect of the present disclosure, it is further provided a method of manufacturing a low-temperature polysilicon thin film transistor.

According to an exemplary embodiment, the method of manufacturing a low-temperature polysilicon thin film transistor may include:

providing a substrate;

forming a gate electrode on the substrate;

forming an amorphous silicon layer on the gate electrode;

forming an ohmic contact layer on the amorphous silicon layer;

forming a source/drain layer on the ohmic contact layer;

forming a pattern of the ohmic contact layer through a patterning process so that a portion of the ohmic contact layer in a region corresponding to a polysilicon region to be formed is etched; and performing a laser annealing process on the amorphous silicon layer by using a mask so that amorphous silicon in a partial region of the amorphous silicon layer is converted into polysilicon.

An orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

In some embodiments, the method may further include:

forming an etch stop layer on the amorphous silicon layer; and forming a pattern of the etch stop layer through a patterning process, wherein the step of forming the ohmic contact layer on the amorphous silicon layer may include: forming the ohmic contact layer on both the pattern of the etch stop layer and the amorphous silicon layer, and wherein an orthogonal projection of a formed polysilicon region on the substrate falls within an orthogonal projection of the pattern of the etch stop layer on the substrate, and an area of the orthogonal projection of the formed polysilicon region on the substrate is smaller than an area of the orthogonal projection of the pattern of the etch stop layer on the substrate.

According to some embodiments, the orthogonal projection of the pattern of the etch stop layer on the substrate falls within the orthogonal projection of the gate electrode on the substrate, and the area of the orthogonal projection of the pattern of the etch stop layer on the substrate is smaller than the area of the orthogonal projection of the gate electrode on the substrate.

According to some embodiments, the step of forming a pattern of the ohmic contact layer through a patterning process so that both a portion of the ohmic contact layer in a region corresponding to a polysilicon region to be formed is etched may include:

etching the portion of the ohmic contact layer in the region corresponding to the polysilicon region to be formed, so that a portion of the pattern of the etch stop layer is exposed and both ends of the pattern of the etch stop layer in a direction parallel to the substrate are covered by the ohmic contact layer.

According to some embodiments, the step of performing a laser annealing process on the amorphous silicon layer by using a mask so that amorphous silicon in a partial region of the amorphous silicon layer is converted into polysilicon may include:

keeping a laser light source stationary to prolong a time period for which a laser beam emitted by the laser light source irradiates on the amorphous silicon layer, so that amorphous silicon in a predetermined portion of the amorphous silicon layer is converted into polysilicon.

According to some embodiments, after the step of performing a laser annealing process on the amorphous silicon layer by using a mask so that amorphous silicon in a partial region of the amorphous silicon layer is converted into polysilicon, the method may include:

forming a source/drain layer on the ohmic contact layer; and forming a pattern of the source/drain layer through a patterning process so that a portion of the source/drain layer in the region corresponding to the formed polysilicon region is etched.

BRIEF DESCRIPTION OF THE DRAWINGS

The following descriptions of the present disclosure with reference to the accompanying drawings will make other objectives and advantages of the present disclosure become apparent, and may help to provide a thorough understanding of the present disclosure.

DETAINED DESCRIPTION OF PREFERRED EMBODIMENTS OF THE DISCLOSURE

Figure 1:
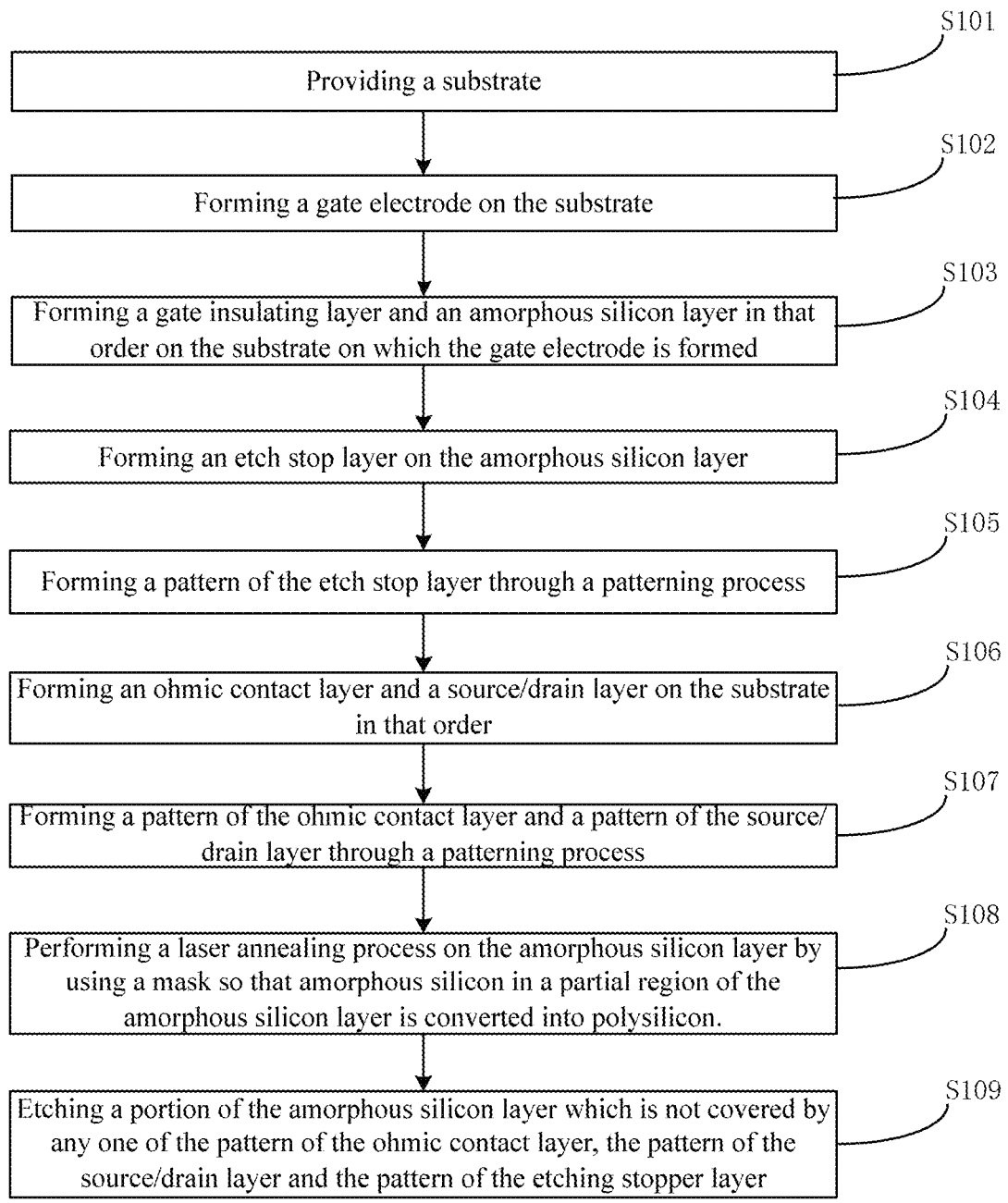
FIG. 1 is a flowchart of a method of manufacturing a low-temperature polysilicon thin film transistor according to an embodiment of the present disclosure.

The technical solutions of the present disclosure will be further described in detail through the following embodiments with reference to the accompanying drawings. In the specification, the same or similar reference numerals designate the same or similar components. The following descriptions of embodiments of the present disclosure with reference to the accompanying drawings are intended to explain the general inventive concept of the present disclosure and should not be construed as limiting the present disclosure.

In addition, in the following detailed descriptions, for purpose of explanation, numerous specific details are set forth in order to provide a thorough understanding of the disclosed embodiments. However, it is apparent that one or more embodiments may also be practiced without these specific details. Well-known structures and devices are shown by way of illustration to simplify the drawings.

It should be noted that "on", "formed on" and "disposed on" as used herein may mean that one layer is directly formed or disposed on another layer, and may also mean that one layer is indirectly formed or disposed on another layer, that is, there may be other layers between the one layer and the another layer.

According to one aspect of the present disclosure, a method of manufacturing a low-temperature polysilicon thin film transistor is provided.

FIG. 1 shows a flowchart of a method of manufacturing a low-temperature polysilicon thin film transistor according to an embodiment of the present disclosure. FIGS. 2, 2A and 3-9 schematically illustrate structures formed after main steps of the method of manufacturing a low-temperature polysilicon thin film transistor according to an embodiment of the present disclosure. Next, the method of manufacturing a low-temperature polysilicon thin film transistor according to the embodiment of the present disclosure will be described in detail with reference to FIGS. 1-9.

Figure 2:
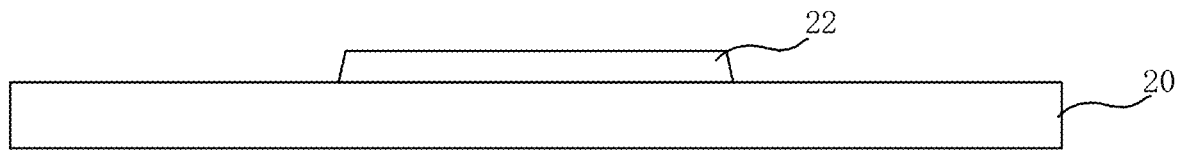
FIGS. 2, 2A and 3-9 schematically illustrate structures formed after main steps of the method of manufacturing a low-temperature polysilicon thin film transistor according to an embodiment of the present disclosure.

In step S101, a substrate 20 is provided, as shown in FIG. 2. Specifically, the substrate may be a transparent substrate, such as a glass substrate.

Figure 2A:
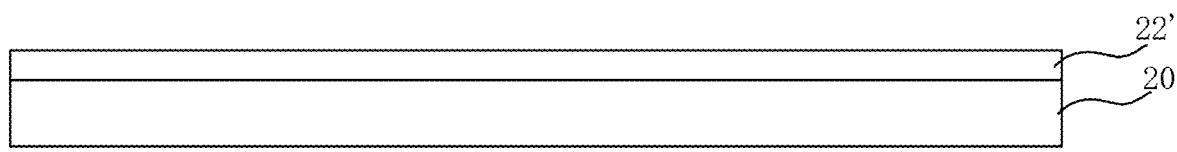

In step S102, a gate electrode 22 is formed on the substrate 20, as shown in FIG. 2. Specifically, a gate material layer 22' may be deposited on the entire substrate 20, as shown in FIG. 2A, and then a pattern of the gate material layer (i.e. the gate electrode 22 shown in FIG. 2) may be formed through a patterning process. It should be noted that the patterning process herein generally includes steps of photoresist coating, masking, exposure, development, etching, photoresist stripping and the like, and structures in the embodiments of the present disclosure may be formed through various common patterning processes in the art according to actual process requirements.

Figure 3:
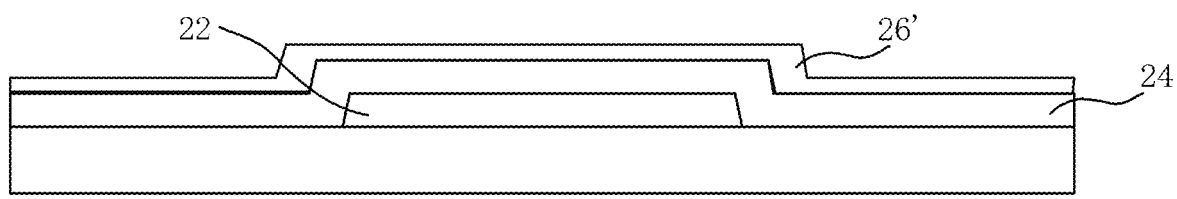

In step S103, a gate insulating layer 24 and an amorphous silicon layer 26' are formed in that order on the substrate 20 on which the gate electrode 22 is formed, as shown in FIG. 3. Specifically, a gate insulating layer 24 may be firstly deposited on the entire substrate 20 on which the gate electrode 22 is formed, and then an amorphous silicon layer 26' may be deposited on the entire gate insulating layer 24. In some embodiments, after the amorphous silicon layer 26' is formed, a dehydrogenation process is further performed to avoid hydrogen explosion during a crystallization of the amorphous silicon. Those skilled in the art should understand that the amorphous silicon layer may be an active layer or a semiconductor layer of the thin film transistor.

Figure 4:
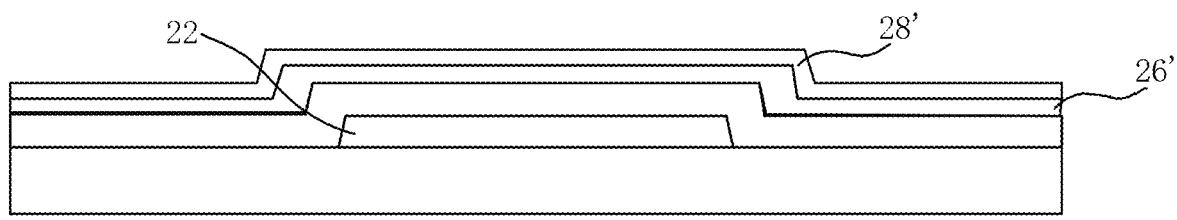

In step S104, an etch stop layer 28' is formed on the amorphous silicon layer 26', as shown in FIG. 4. Specifically, the etch stop layer 28' is formed on the amorphous silicon layer 26' by means of deposition. In some embodiments, the etch stop layer 28' may be formed of silicon oxide or silicon nitride.

Figure 5:
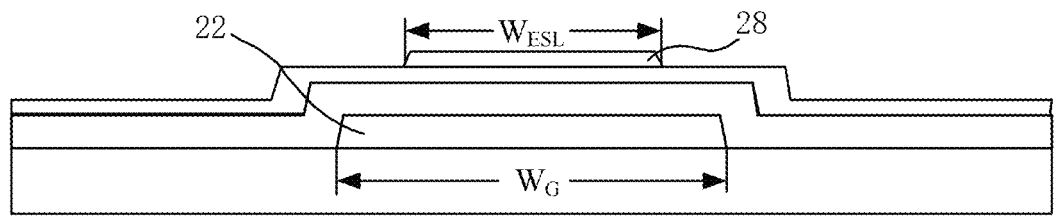

In step S105, a pattern 28 of the etch stop layer is formed through a patterning process, as shown in FIG. 5. In some embodiments, an orthogonal projection of the pattern 28 of the etch stop layer on the substrate 20 falls within an orthogonal projection of the gate electrode 22 on the substrate 20, and an area of the orthogonal projection of the pattern 28 of the etch stop layer on the substrate 20 is smaller than an area of the orthogonal projection of the gate electrode 22 on the substrate 20. In the embodiment shown in FIG. 5, a width $W_{ESL}$ of the pattern 28 of the etch stop layer in a direction parallel to the substrate 20 is smaller than a width $W_G$ of the gate electrode 22 in the direction parallel to the substrate 20.

Figure 6:
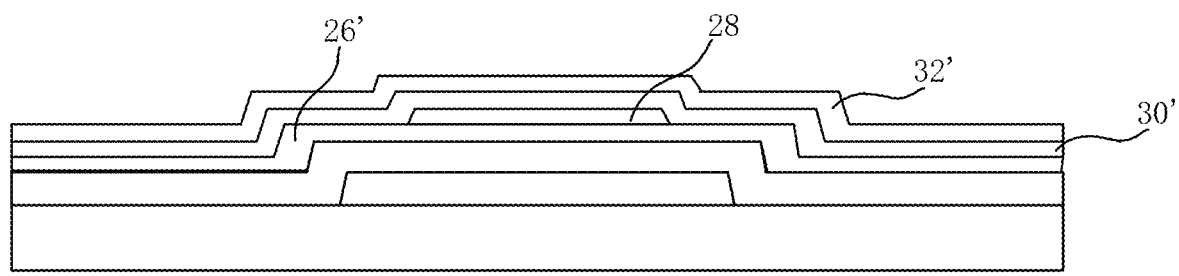

In step S106, an ohmic contact layer 30' and a source/drain layer 32' are formed on the substrate 20 in that order, as shown in FIG. 6. In some embodiments, the ohmic contact layer 30' and the source/drain layer 32' are formed on the substrate 20 in that order by means of deposition to cover the pattern 28 of the etch stop layer and the amorphous silicon layer 26'. In some embodiments, the ohmic contact layer 30' is formed of doped amorphous silicon, for example, formed of N-type doped amorphous silicon or P-type doped amorphous silicon. The source/drain layer 32' is formed of metal material.

In some embodiments, the step of forming the ohmic contact layer 30' on the substrate 20 may include: depositing a layer of pre-doped N-type doped amorphous silicon or pre-doped P-type doped amorphous silicon on the substrate 20. In other embodiments, the step of forming the ohmic contact layer 30' on the substrate 20 may include: depositing a second amorphous silicon layer on the substrate 20; and doping the second amorphous silicon layer.

Figure 7:
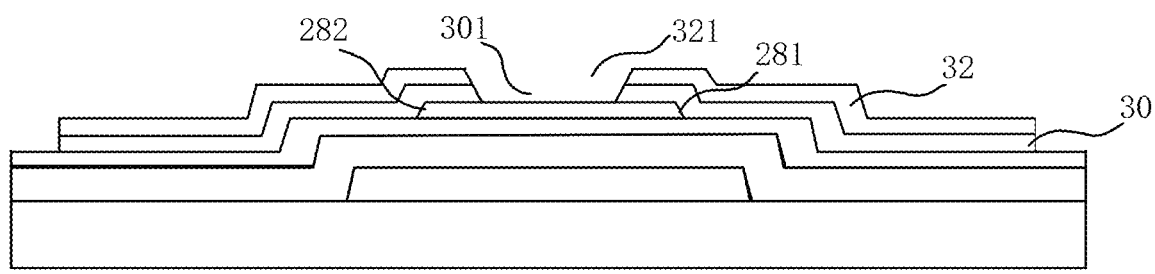

In step S107, a pattern 30 of the ohmic contact layer and a pattern 32 of the source/drain layer are formed through a patterning process, as shown in FIG. 7. In some embodiments, the pattern 30 of the ohmic contact layer and the pattern 32 of the source/drain layer may be the same, such that the pattern 30 of the ohmic contact layer and the pattern 32 of the source/drain layer may be formed through one patterning process, thereby simplifying the manufacturing process and improving manufacturing efficiency. In an example, considering that the ohmic contact layer 30' and the source/drain layer 32' are formed of amorphous silicon material and metal material respectively, during the pattern 30 of the ohmic contact layer and the pattern 32 of the source/drain layer are formed through a patterning process, the process steps of photoresist coating, masking, exposure, development and photoresist stripping may be the same, but the etching process steps may be different. Specifically, the pattern 30 of the ohmic contact layer may be formed through a dry etching process while the pattern 32 of the source/drain layer may be formed through a wet etching process. In some embodiments, as shown in FIG. 7, the pattern 30 of the ohmic contact layer and the pattern 32 of the source/drain layer are formed through a patterning process in such a way that a portion of the pattern of the etch stop layer is exposed and that both ends 281, 282 of the pattern 28 of the etch stop layer in the direction parallel to the substrate are covered by the pattern 30 of the ohmic contact layer. That is, both a width of an opening 321 in the pattern 32 of the source/drain layer and a width of an opening 301 in the pattern 30 of the ohmic contact layer are smaller than the width $W_{ESL}$ of the pattern 28 of the etch stop layer in the direction parallel to the substrate.

In step S108, a laser annealing process is performed on the amorphous silicon layer 26' by using a mask 100, so that amorphous silicon in a partial region of the amorphous silicon layer 26' is converted into polysilicon.

Figure 8A:
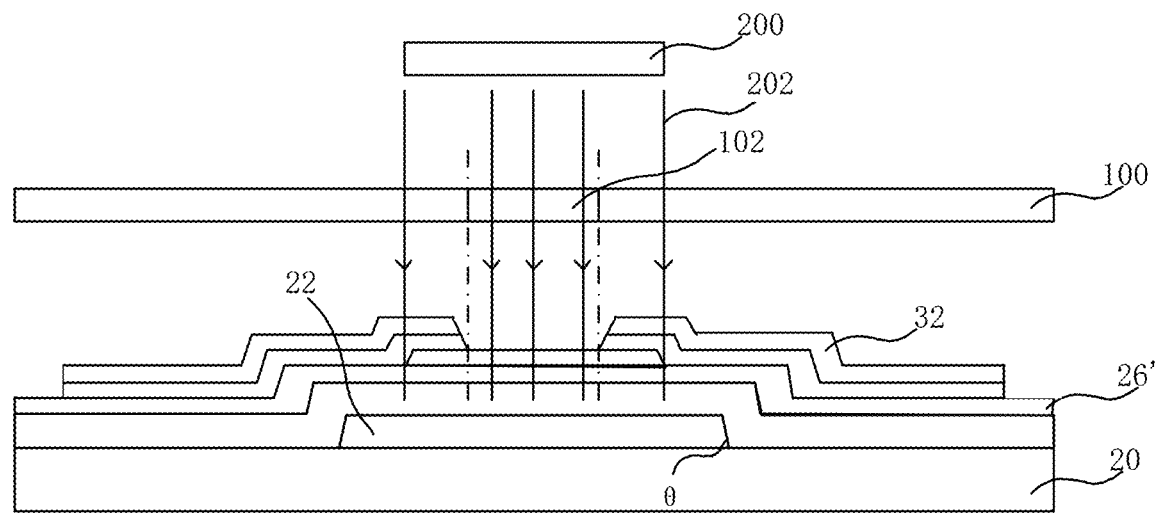

Specifically, as shown in FIG. 8A, a laser light source 200, the mask 100 and the substrate 20 are sequentially disposed from top to bottom. A laser beam 202 emitted from the laser light source 200 irradiates towards a side of the substrate 20, at which the amorphous silicon layer 26' is formed, through opening regions 102 of the mask 100. In an example, the laser annealing process may be an excimer laser annealing process, and accordingly, the laser beam 202 emitted from the laser light source 200 is an excimer laser beam 202. When the excimer laser beam 202 continues to irradiate on a portion of the amorphous silicon layer 26' for a period of time, the irradiated portion of the amorphous silicon layer 26' may be melted and then crystallized to be converted into polysilicon.

In some embodiments, an orthogonal projection of the opening region 102 of the mask 100 on the substrate 20 is located within the orthogonal projection of the gate electrode 22 on the substrate 20, and an area of the orthogonal projection of the opening region 102 of the mask 100 on the substrate 20 is smaller than an area of the orthogonal projection of the gate electrode 22 on the substrate 20, as shown in FIG. 8A. With such an arrangement, the laser light emitted from the laser light source 200 irradiates only onto a region corresponding to the gate electrode 22 without affecting the amorphous silicon in a region which does not correspond to the gate electrode 22. Moreover, in a common laser annealing process, since no mask is provided, the laser beam may irradiate on the entire range of the substrate 20, and a step of the gate electrode, for example, the step due to a gradient angle θ (shown in FIG. 8A) of the gate electrode may cause unevenness in the crystallization, resulting in a large leakage current of the thin film transistor and a deterioration in a performance of the thin film transistor. In the embodiment of the present disclosure, the mask is provided such that the laser light beam is focused only over the gate electrode, thereby avoiding unevenness in the crystallization due to the step in the common laser annealing process. Optionally, the area of the orthogonal projection of the opening region 102 of the mask on the substrate may be slightly larger than an area of an orthogonal projection of the opening 321 in the pattern 32 of the source/drain layer on the substrate, that is, the orthogonal projection of the opening 321 in the pattern 32 of the source/drain layer on the substrate is located within the orthogonal projection of the opening region 102 of the mask on the substrate, and the area of the orthogonal projection of the opening 321 in the pattern 32 of the source/drain layer on the substrate is slightly smaller than the area of the orthogonal projection of the opening region 102 of the mask on the substrate. In this way, the emitted laser light may also be confined within a channel region by the pattern of the source/drain layer, so that the amorphous silicon in the channel region under the etch stop layer is crystallized. Thus, the crystallized region may be precisely controlled and an alignment requirement of the mask may be reduced, thereby facilitating mass production.

Further, in the embodiment shown in FIG. 8A, since the source/drain layer is generally formed of metal material and has good thermal conductivity, both the pattern 30 of the ohmic contact layer and the amorphous silicon layer 26' below the source/drain layer cannot absorb thermal energy of the excimer laser beam 202 during the laser irradiation is performed. That is, the pattern 32 of the source/drain layer also serves as a shielding layer, so that the portion of the amorphous silicon layer 26' shielded by the pattern 32 will not be converted into polysilicon. Moreover, since the source/drain layer is generally formed of metal material and has good thermal conductivity, the source/drain layer may ensure that the portion of the amorphous silicon layer shielded by the source/drain layer is not converted into polysilicon. In the embodiment, not only the range of the laser irradiation is positioned by means of the mask, but also a self-aligned laser annealing is performed on the channel region by using the pattern of the source/drain layer as the shielding layer, so that the positional accuracy of the formed polysilicon region may be guaranteed and a thin film transistor with a narrow channel may be formed.

Figure 8B:
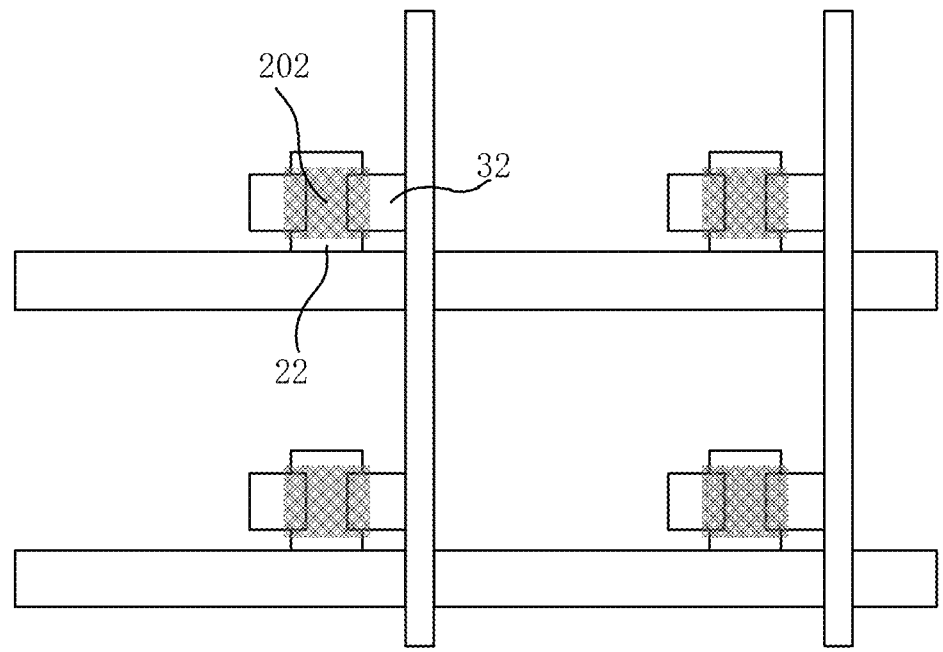

Referring to FIGS. 8A and 8B, the laser light source 200 emits the laser beam 202. The laser beam 202 first passes through the mask 100, and the laser beam 202 is allowed to pass through the mask 100 only through the opening region 102 of the mask. Since the orthogonal projection of the opening region 102 of the mask 100 on the substrate 20 is located within the orthogonal projection of the gate electrode 22 on the substrate 20 and the area of the orthogonal projection of the opening region 102 of the mask on the substrate 20 is smaller than the area of the gate electrode 22 on the substrate, the irradiation range of the laser beam 202 on the substrate 20 falls within the orthogonal projection of the gate electrode 22 on the substrate 20, as shown in FIG. 8B. Then, the laser beam 202 that passes only through the opening region 321 in the pattern 32 of the source/drain layer is allowed to irradiate on a portion of the amorphous silicon layer 26', so that the portion of the amorphous silicon layer 26' is converted into polysilicon, as shown in FIG. 8A. That is, in the embodiment, the pattern 32 of the source/drain layer also serves as the shielding layer, so that the portion of the amorphous silicon layer 26' which is shielded by the pattern 32 is not converted into polysilicon. Meanwhile, since the pattern 28 of the etch stop layer does not absorb the thermal energy of the laser beam 202, a portion of the amorphous silicon layer 26' below the pattern 28 of the etch stop layer may absorb the thermal energy of the laser beam 202 to form the polysilicon region.

Figure 9:
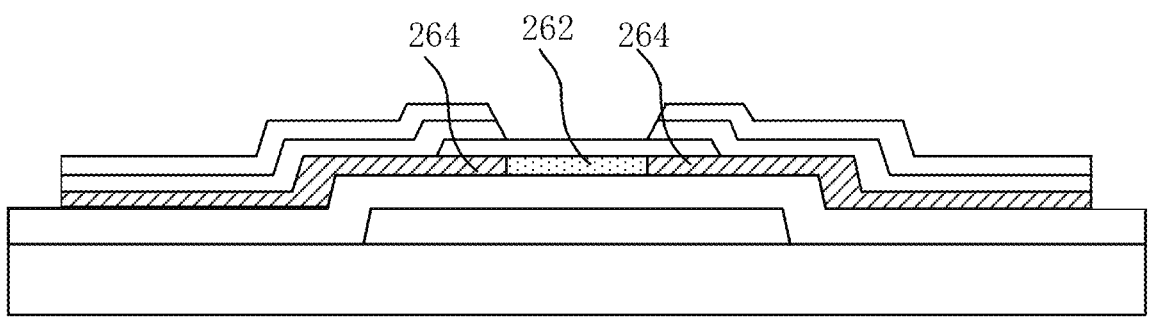

In this way, the channel region of the thin film transistor is formed to include a polysilicon region 262 in the middle of the channel region and amorphous silicon regions 264 located on both sides of the polysilicon region 262, as shown in FIG. 9. That is, the channel region of the thin film transistor is formed into a-Si/p-Si/a-Si structure, so that it may be ensured that an off-state leakage current is small. In addition, in the embodiment, an orthogonal projection of the polysilicon region 262 on the substrate 20 is located within the orthogonal projection of the pattern 28 of the etch stop layer on the substrate 20 and an area of the orthogonal projection of the polysilicon region on the substrate is smaller than an area of the orthogonal projection of the pattern of the etch stop layer on the substrate, and the orthogonal projection of the pattern 28 of the etch stop layer on the substrate 20 is located within the orthogonal projection of the gate electrode 22 on the substrate 20 and the area of the orthogonal projection of the pattern 28 of the etch stop layer on the substrate 20 is smaller than the area of the orthogonal projection of the gate electrode 22 on the substrate 20, thus the laser beam only passes through the opening region of the mask and the opening of the pattern of the source/drain layer. In this way, the positional accuracy of the middle p-Si may be guaranteed.

In the embodiment, as described above, the orthogonal projection of the pattern 28 of the etch stop layer on the substrate 20 is located within the orthogonal projection of the gate electrode 22 on the substrate 20 and the area of the orthogonal projection of the pattern 28 of the etch stop layer on the substrate 20 is smaller than the area of the orthogonal projection of the gate electrode 22 on the substrate 20, that is, the width $W_{ESL}$ of the pattern 28 of the etch stop layer in the direction parallel to the substrate 20 is smaller than the width $W_G$ of the gate electrode 22 in the direction parallel to the substrate 20. In this way, a width of the two a-Si portions in the a-Si/p-Si/a-Si structure in the direction parallel to the substrate 20 is not too large, so that an on-state current of the thin film transistor is not influenced excessively.

In some embodiments, the laser light source 200 may be kept stationary to prolong a time period for which the laser beam 202 emitted from the laser light source irradiates on the amorphous silicon layer 26', that is, the laser beam 202 may continuously irradiate on a predetermined portion of the amorphous silicon layer 26' for a predetermined time period, so that the amorphous silicon in the predetermined portion of the amorphous silicon layer is completely converted into polysilicon. Compared to the process in which the common laser annealing is performed to form polysilicon, it is not necessary to move the laser light source, that is, it is not necessary to form a plurality of crystal tracks, thereby avoiding a phenomenon of non-uniform polysilicon between the plurality of crystal tracks. In the embodiments of the present disclosure, the laser light source is kept stationary to perform a continuous irradiation, so that the uniformity of the formed polysilicon may be further ensured.

In some embodiments, the mask 100 may be a build-in mask of the laser light source 200. Alternatively, the mask 100 may be a separate mask, that is, it is not a build-in mask of the laser light source 200.

In step S109, by using the pattern 30 of the ohmic contact layer and/or the pattern 32 of the source/drain layer as a mask, a portion of the amorphous silicon layer 26', which is not covered by any one of the pattern 30 of the ohmic contact layer, the pattern 32 of the source/drain layer and the pattern 28 of the etching stopper layer, on the substrate 20 is etched, as shown in FIG. 9. In this step, the pattern 28 of the etch stop layer overlies the channel region of the amorphous silicon layer 26' to prevent the a-Si/p-Si/a-Si structure in the channel region from being etched, thereby solving the problem that the back channel is damaged. In some embodiments, the portion of the amorphous silicon layer 26', which is not covered by the pattern 30 of the ohmic contact layer, the pattern 32 of the source/drain layer and the pattern 28 of the etching stopper layer, on the substrate 20 is etched by means of dry etching.

Figure 10:
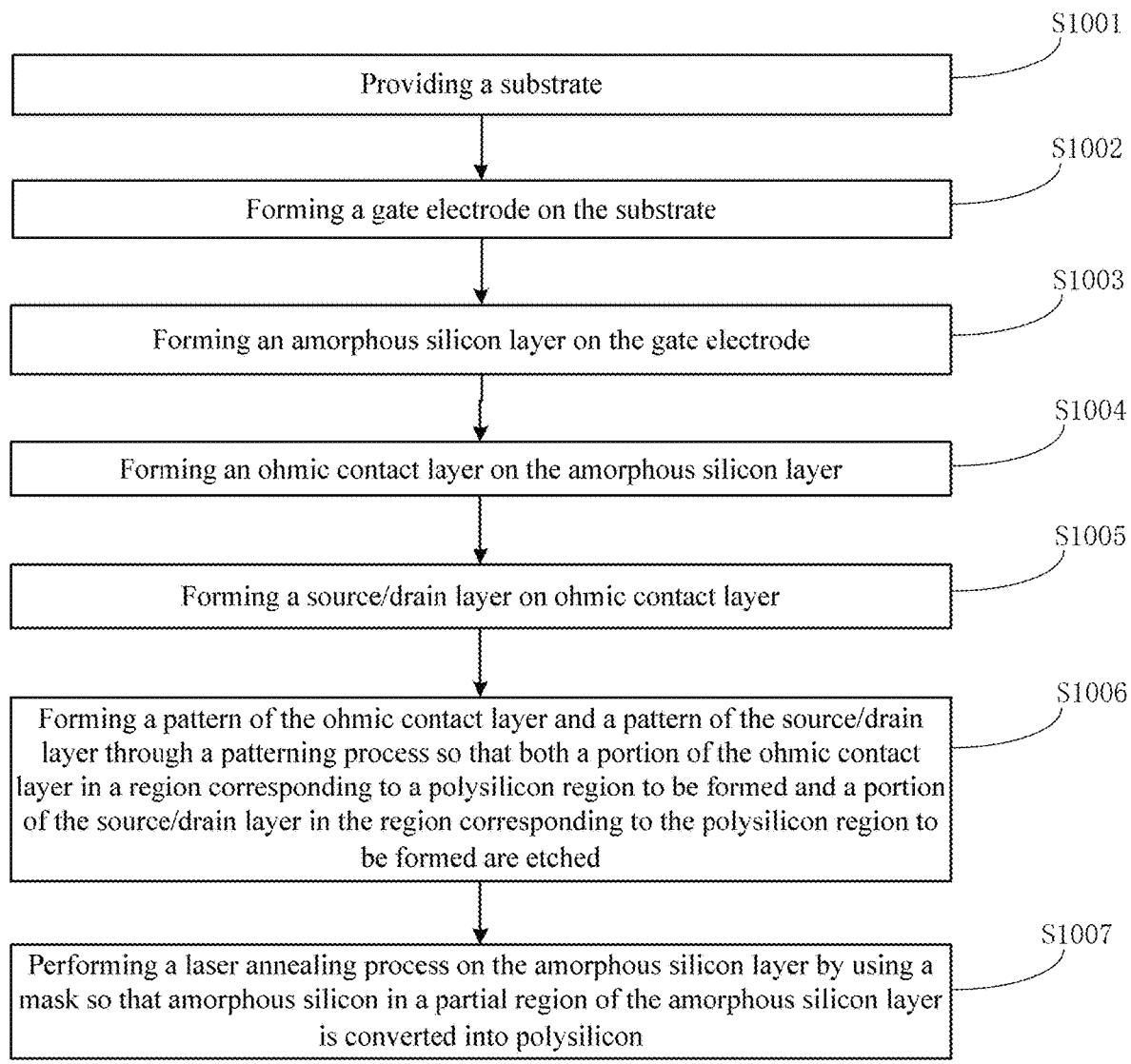
FIG. 10 is a flowchart of a method of manufacturing a low-temperature polysilicon thin film transistor according to another embodiment of the present disclosure.

In the above embodiments, steps of the method according to the embodiments of the present disclosure are described in detail in conjunction with FIGS. 1-9, however, those skilled in the art should understand that in other embodiments of the present disclosure, some steps and details may be omitted. For example, as shown in FIG. 10, a method of manufacturing a low-temperature polysilicon thin film transistor according to an embodiment of the present disclosure may include the following steps:

S1001: providing a substrate;
S1002: forming a gate electrode on the substrate;
S1003: forming an amorphous silicon layer on the gate electrode;
S1004: forming an ohmic contact layer on the amorphous silicon layer;
S1005: forming a source/drain layer on the ohmic contact layer;
S1006: forming a pattern of the ohmic contact layer and a pattern of the source/drain layer through a patterning process so that both a portion of the ohmic contact layer in a region corresponding to a polysilicon region to be formed and a portion of the source/drain layer in the region corresponding to the polysilicon region to be formed are etched; and S1007: performing a laser annealing process on the amorphous silicon layer by using a mask so that amorphous silicon in a partial region of the amorphous silicon layer is converted into polysilicon.

In an example, an orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

In the embodiment, not only the range of the laser irradiation is positioned by means of the mask, but also a self-aligned laser annealing is performed on the channel region by using the pattern of the source/drain layer as the shielding layer, so that the positional accuracy of the formed polysilicon region may be guaranteed and a thin film transistor with a narrow channel may be formed.

Figure 11:
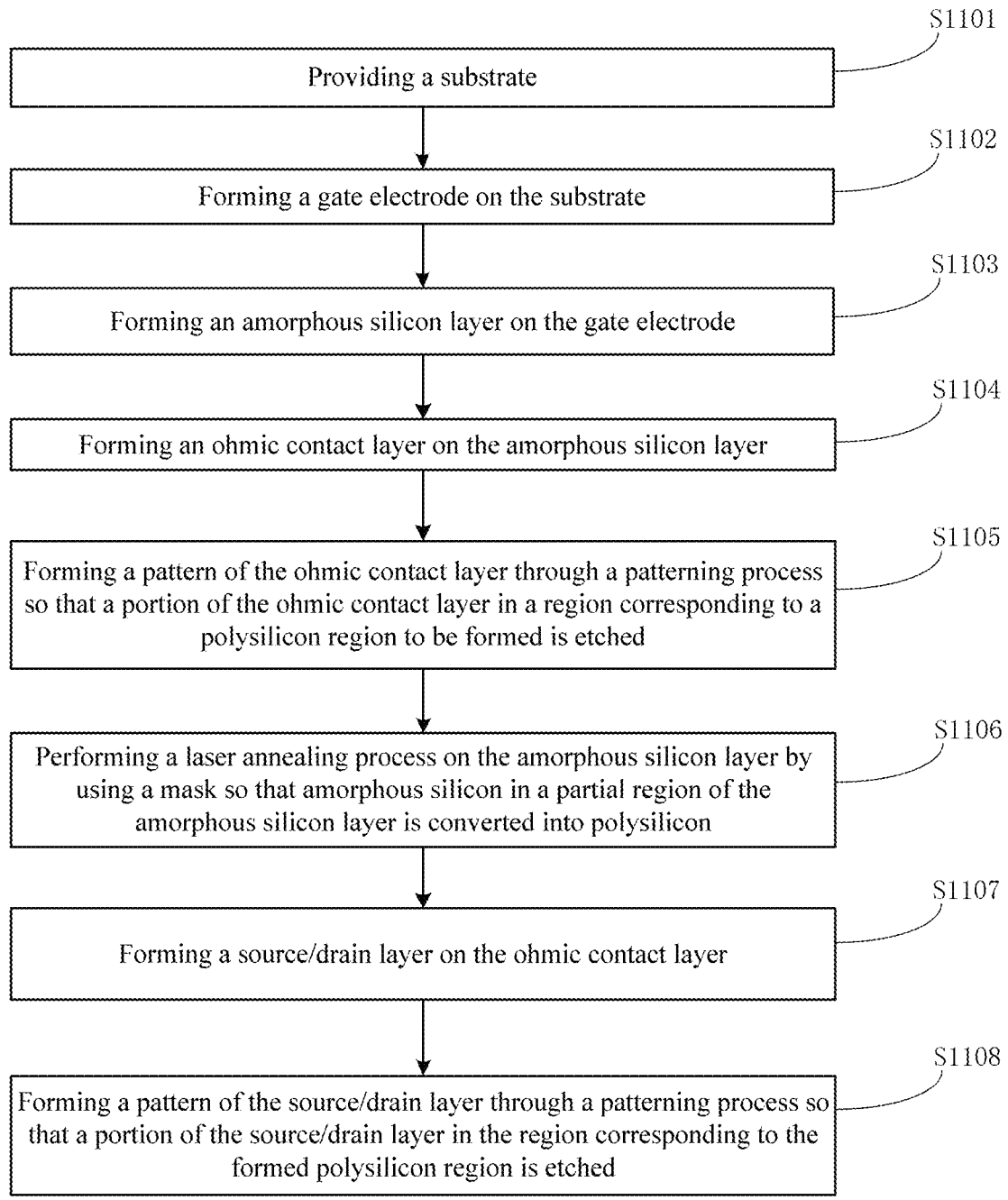
FIG. 11 is a flowchart of a method of manufacturing a low-temperature polysilicon thin film transistor according to yet another embodiment of the present disclosure.

In alternative embodiments, the various steps of the method may not be performed in the order described in the above embodiment. For example, as shown in FIG. 11, a method of manufacturing a low-temperature polysilicon thin film transistor according to an alternative embodiment may include the following steps:

S1101: providing a substrate;

S1102: forming a gate electrode on the substrate;

S1103: forming an amorphous silicon layer on the gate electrode;

S1104: forming an ohmic contact layer on the amorphous silicon layer;

S1105: forming a pattern of the ohmic contact layer through a patterning process so that a portion of the ohmic contact layer in a region corresponding to a polysilicon region to be formed is etched; and S1106: performing a laser annealing process on the amorphous silicon layer by using a mask so that amorphous silicon in a partial region of the amorphous silicon layer is converted into polysilicon.

In an example, an orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

In the embodiment, referring back to FIG. 8A, the pattern 30 of the ohmic contact layer above the amorphous silicon layer 26' may absorb the thermal energy of the laser beam 202 to form an ohmic contact layer which has silicon atoms in a partially or completely crystalline state. Thus, the energy of the laser beam 202 gradually attenuates in the pattern 30 of the ohmic contact layer and cannot be transferred to the amorphous silicon layer 26' below the ohmic contact layer. At the same time, since the pattern 28 of the etch stop layer does not absorb the thermal energy of the laser beam 202, a portion of the amorphous silicon layer 26' below the pattern 28 of the etch stop layer may absorb the thermal energy of the laser beam 202 to form a polysilicon region. That is, in the embodiment, not only the range of laser irradiation is positioned by means of the mask, but also the self-aligned laser annealing is performed on the channel region by using the pattern of the ohmic contact layer as the shielding layer, thereby forming the channel region having the a-Si/p-Si/a-Si structure.

In the embodiment, after performing a laser annealing process on the amorphous silicon layer by using a mask so that amorphous silicon in a partial region of the amorphous silicon layer is converted into polysilicon, the following steps may be performed:

S1107: forming a source/drain layer on the ohmic contact layer; and

S1108: forming a pattern of the source/drain layer through a patterning process so that a portion of the source/drain layer in the region corresponding to the formed polysilicon region is etched.

In a further embodiment, step S109 in the foregoing embodiment may also be performed after step S1108 as needed. In addition, steps S1108 and S109 may also be performed simultaneously through a patterning process. That is, the pattern of the source/drain layer and the pattern of the amorphous silicon layer may be formed through the same one patterning process.

According to another aspect of the present disclosure, there is also provided a low-temperature polysilicon thin film transistor manufactured by the method described in the above embodiments.

Figure 12:
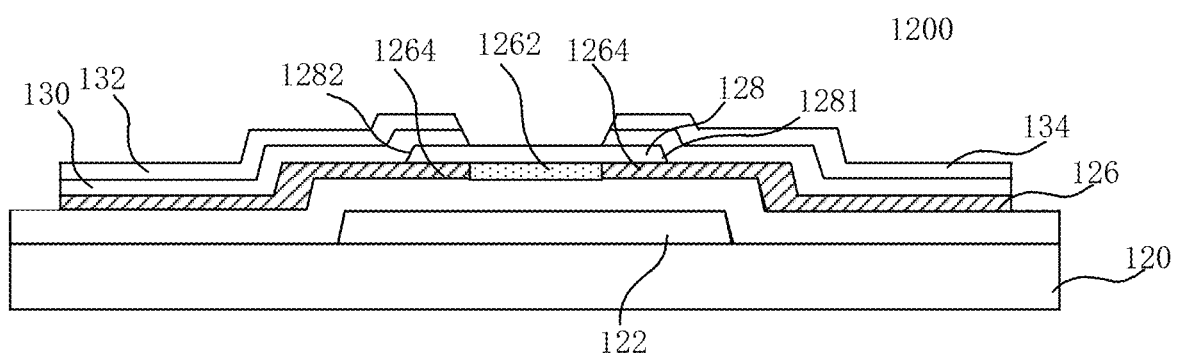
FIG. 12 is a schematic structural view of a low-temperature polysilicon thin film transistor according to an embodiment of the present disclosure.

Referring to FIG. 12, a low-temperature polysilicon thin film transistor 1200 according to an embodiment of the present disclosure is formed on a substrate 120, and the low-temperature polysilicon thin film transistor 1200 may include: a gate electrode 122 on the substrate; and an active layer 126 on the gate electrode. The active layer includes a channel region. The channel region has a polysilicon region 1262 and amorphous silicon regions 1264 located on both sides of the polysilicon region respectively. An orthogonal projection of the polysilicon region 1262 on the substrate is located within an orthogonal projection of the gate electrode 122 on the substrate, and an area of the orthogonal projection of the polysilicon region on the substrate is smaller than an area of the orthogonal projection of the gate electrode on the substrate.

By designing a low-temperature polysilicon thin film transistor having such a structure, the channel region having a-Si/p-Si/a-Si structure may be easily realized when the polysilicon region is formed by using the laser annealing process, and a high positioning accuracy of the middle polysilicon region may be realized.

Still referring to FIG. 12, the low-temperature polysilicon thin film transistor 1200 may further include an etch stop layer 128 on the active layer. As shown in FIG. 12, the orthogonal projection of the polysilicon region 1262 on the substrate is located within an orthogonal projection of the etch stop layer 128 on the substrate, and the area of the orthogonal projection of the polysilicon region on the substrate is smaller than an area of the orthogonal projection of the etch stop layer on the substrate. The etch stop layer is provided to protect the active layer below the etch stop layer, in particular the channel region in the active layer, so that the problem that the back channel is damaged may be solved.

In some embodiments, the orthogonal projection of the etch stop layer 128 on the substrate is located within the orthogonal projection of the gate electrode 122 on the substrate, and the area of the orthogonal projection of the etch stop layer on the substrate is smaller than the area of the orthogonal projection of the gate electrode on the substrate.

In some embodiments, a material of the etch stop layer 128 may include silicon oxide or silicon nitride.

In the embodiment shown in FIG. 12, the low-temperature polysilicon thin film transistor 1200 further includes an ohmic contact layer 130 on both the etch stop layer 128 and the active layer 126. As shown in FIG. 12, in the region corresponding to the polysilicon region 1262, a portion of the ohmic contact layer 130 above the etch stop layer 128 is etched, and both ends 1281, 1282 of the etch stop layer 128 in the direction parallel to the substrate are covered by the ohmic contact layer 130. In some embodiments, a material of the ohmic contact layer 130 may include N-type doped amorphous silicon or P-type doped amorphous silicon.

In the illustrated embodiment, the low-temperature polysilicon thin film transistor 1200 further includes a source electrode 132 and a drain electrode 134 on the ohmic contact layer 130. Both a pattern of the source electrode and a pattern of the drain electrode may be the same as the pattern of the ohmic contact layer 130.

According to still another aspect of the present disclosure, it is also possible to provide a display substrate. The display substrate may include the low-temperature polysilicon thin film transistor as described above.

According to yet further aspect of the present disclosure, it is also possible to provide a display device which may include the low-temperature polysilicon thin film transistor or the display substrate as described above. The display device may include, but is not limited to, any product or component that has a display function, such as electronic paper, mobile phone, tablet computer, television, display, notebook computer, digital photo frame, navigator and the like.

Although some embodiments of the present disclosure have been illustrated and described, those skilled in the art will understand that changes may be made to these embodiments without departing from the principle and essence of the present disclosure, and the scope of the present disclosure shall be defined by the claims and equivalents thereof.

What is claimed is:

1. A method of manufacturing a low-temperature polysilicon thin film transistor, comprising:
    providing a substrate;
    forming a gate electrode on the substrate;
    forming an amorphous silicon layer on the gate electrode;
    forming an ohmic contact layer on the amorphous silicon layer;
    forming a source/drain layer on the ohmic contact layer;
    forming a pattern of the ohmic contact layer and a pattern of the source/drain layer through a patterning process so that both a portion of the ohmic contact layer in a region corresponding to a polysilicon region to be formed and a portion of the source/drain layer in the region corresponding to the polysilicon region to be formed are etched; and
    performing a laser annealing process on the amorphous silicon layer by using a mask and by using the pattern of the source/drain layer as a shielding layer so that amorphous silicon in a partial region of the amorphous silicon layer is converted into polysilicon,
    wherein the mask is located above and spaced apart form the shield layer by an interval in a direction in which a laser beam propagates; and
    wherein an orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

2. The method of claim 1, further comprising:
    forming an etch stop layer on the amorphous silicon layer; and
    forming a pattern of the etch stop layer through a patterning process,
    wherein the step of forming the ohmic contact layer on the amorphous silicon layer comprises: forming the ohmic contact layer on both the pattern of the etch stop layer and the amorphous silicon layer, and
    wherein an orthogonal projection of a formed polysilicon region on the substrate falls within an orthogonal projection of the pattern of the etch stop layer on the substrate, and an area of the orthogonal projection of the formed polysilicon region on the substrate is smaller than an area of the orthogonal projection of the pattern of the etch stop layer on the substrate.

3. The method of claim 2, wherein the orthogonal projection of the pattern of the etch stop layer on the substrate falls within the orthogonal projection of the gate electrode on the substrate, and the area of the orthogonal projection of the pattern of the etch stop layer on the substrate is smaller than the area of the orthogonal projection of the gate electrode on the substrate.

4. The method of claim 2, wherein the step of forming a pattern of the ohmic contact layer and a pattern of the source/drain layer through a patterning process so that both a portion of the ohmic contact layer in a region corresponding to a polysilicon region to be formed and a portion of the source/drain layer in the region corresponding to the polysilicon region to be formed are etched comprises:
    etching the portion of the ohmic contact layer in the region corresponding to the polysilicon region to be formed and the portion of the source/drain layer in the region corresponding to the polysilicon region to be formed, so that a portion of the pattern of the etch stop layer is exposed and both ends of the pattern of the etch stop layer in a direction parallel to the substrate are covered by the ohmic contact layer.

5. The method of claim 2, wherein after the step of performing a laser annealing process on the amorphous silicon layer by using a mask so that amorphous silicon in a partial region of the amorphous silicon layer is converted into polysilicon, the method further comprises:
    etching a portion of the amorphous silicon layer on the substrate by using at least one of the pattern of the ohmic contact layer and the pattern of the source/drain layer as a mask, the portion of the amorphous silicon layer being not covered by any one of the pattern of the etch stop layer, the pattern of the ohmic contact layer and the pattern of the source/drain layer.

6. The method of claim 1, wherein the step of performing a laser annealing process on the amorphous silicon layer by using a mask so that amorphous silicon in a partial region of the amorphous silicon layer is converted into polysilicon comprises:
    keeping a laser light source stationary to prolong a time period for which a laser beam emitted by the laser light source irradiates on the amorphous silicon layer, so that amorphous silicon in a predetermined portion of the amorphous silicon layer is converted into polysilicon.

7. The method of claim 1, wherein the step of forming a pattern of the ohmic contact layer and a pattern of the source/drain layer through a patterning process comprises:
    forming the pattern of the ohmic contact layer and the pattern of the source/drain layer through one patterning process such that the pattern of source/drain layer is the same as the pattern of the ohmic contact layer.

8. The method of claim 1, wherein the step of forming a pattern of the ohmic contact layer and a pattern of the source/drain layer through a patterning process comprises:

forming the pattern of the source/drain layer through wet etching; and forming the pattern of the ohmic contact layer through dry etching.

9. A method of manufacturing a low-temperature polysilicon thin film transistor, comprising:

providing a substrate;

forming a gate electrode on the substrate;

forming an amorphous silicon layer on the gate electrode;

forming an ohmic contact layer on the amorphous silicon layer;

forming a pattern of the ohmic contact layer through a patterning process so that a portion of the ohmic contact layer in a region corresponding to a polysilicon region to be formed is etched; and performing a laser annealing process on the amorphous silicon layer by using a mask and by using the pattern of the ohmic contact layer as a shielding later so that amorphous silicon in a partial region of the amorphous silicon layer is converted into polysilicon, wherein the mask is located above and spaced apart form both the shield layer and a top surface of the thin film transistor by an interval in a direction in which a laser beam propagates; and wherein an orthogonal projection of an opening region of the mask on the substrate is located within an orthogonal projection of the gate electrode on the substrate, and an area of the orthogonal projection of the opening region of the mask on the substrate is smaller than an area of the orthogonal projection of the gate electrode on the substrate.

10. The method of claim 9, further comprising:

forming an etch stop layer on the amorphous silicon layer; and forming a pattern of the etch stop layer through a patterning process, wherein the step of forming the ohmic contact layer on the amorphous silicon layer comprises: forming the ohmic contact layer on both the pattern of the etch stop layer and the amorphous silicon layer, and wherein an orthogonal projection of a formed polysilicon region on the substrate falls within an orthogonal projection of the pattern of the etch stop layer on the substrate, and an area of the orthogonal projection of the formed polysilicon region on the substrate is smaller than an area of the orthogonal projection of the pattern of the etch stop layer on the substrate.

11. The method of claim 10, wherein the orthogonal projection of the pattern of the etch stop layer on the substrate falls within the orthogonal projection of the gate electrode on the substrate, and the area of the orthogonal projection of the pattern of the etch stop layer on the substrate is smaller than the area of the orthogonal projection of the gate electrode on the substrate.

12. The method of claim 10, wherein the step of forming a pattern of the ohmic contact layer through a patterning process so that both a portion of the ohmic contact layer in a region corresponding to a polysilicon region to be formed is etched comprises:

etching the portion of the ohmic contact layer in the region corresponding to the polysilicon region to be formed, so that a portion of the pattern of the etch stop layer is exposed and both ends of the pattern of the etch stop layer in a direction parallel to the substrate are covered by the ohmic contact layer.

13. The method of claim 9, wherein the step of performing a laser annealing process on the amorphous silicon layer by using a mask so that amorphous silicon in a partial region of the amorphous silicon layer is converted into polysilicon comprises:

keeping a laser light source stationary to prolong a time period for which a laser beam emitted by the laser light source irradiates on the amorphous silicon layer, so that amorphous silicon in a predetermined portion of the amorphous silicon layer is converted into polysilicon.

14. The method of claim 9, wherein after the step of performing a laser annealing process on the amorphous silicon layer by using a mask so that amorphous silicon in a partial region of the amorphous silicon layer is converted into polysilicon, the method further comprises:

forming a source/drain layer on the ohmic contact layer; and forming a pattern of the source/drain layer through a patterning process so that a portion of the source/drain layer in the region corresponding to the formed polysilicon region is etched.

* * * * *